United States Patent
Schoeller

(10) Patent No.: US 11,346,869 B2
(45) Date of Patent: May 31, 2022

(54) CALIBRATION SETUP AND METHOD OF MEASURING A SIGNAL GENERATOR

(71) Applicant: Rohde & Schwarz GmbH & Co. KG, Munich (DE)

(72) Inventor: Johannes Schoeller, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/078,489

(22) Filed: Oct. 23, 2020

(65) Prior Publication Data

US 2022/0128608 A1   Apr. 28, 2022

(51) Int. Cl.
  *G01R 23/16*   (2006.01)
  *G01R 35/00*   (2006.01)

(52) U.S. Cl.
  CPC ........... *G01R 23/16* (2013.01); *G01R 35/005* (2013.01)

(58) Field of Classification Search
  CPC .............................. G01R 23/16; G01R 35/005
  USPC .................................. 324/76.19, 76.12, 76.11
  See application file for complete search history.

(56) References Cited

U.S. PATENT DOCUMENTS

| | | | |
|---|---|---|---|
| 5,162,723 A | 11/1992 | Marzalek et al. | |
| 8,823,392 B2 * | 9/2014 | Meierer | H04L 41/0253 709/203 |
| 10,884,046 B1 * | 1/2021 | Tsironis | H01P 5/04 |
| 2011/0301905 A1 * | 12/2011 | Gregg | H04W 24/00 702/106 |
| 2013/0303286 A1 * | 11/2013 | Ferguson | A61B 5/6828 463/37 |
| 2018/0114348 A1 * | 4/2018 | Lu | G06T 7/60 |
| 2018/0217189 A1 | 8/2018 | Feldhaus et al. | |
| 2018/0376268 A1 * | 12/2018 | Kerdranvat | H04S 7/30 |

FOREIGN PATENT DOCUMENTS

JP   2013072848 A   4/2013

* cited by examiner

*Primary Examiner* — Giovanni Astacio-Oquendo
(74) *Attorney, Agent, or Firm* — Christensen O'Connor Johnson Kindness PLLC

(57) ABSTRACT

A calibration setup for measuring a signal generator is provided. The calibration setup includes a calibration unit, a comb generator configured to output a comb signal and the signal generator to be measured that is configured to output an output signal. The comb signal has a higher bandwidth than the output signal. The comb signal has equidistant discrete frequency lines. The output signal has discrete frequency lines. Each of the equidistant discrete frequency lines of the comb signal is different to the discrete frequency lines of the output signal with regard to frequency. The calibration unit is configured to mix the comb signal with the output signal, thereby obtaining a mixed signal.

17 Claims, 1 Drawing Sheet

CALIBRATION SETUP AND METHOD OF MEASURING A SIGNAL GENERATOR

TECHNICAL FIELD

Embodiments of the present disclosure relate to a calibration setup for measuring a signal generator. Further, embodiments of the present disclosure relate to a method of measuring a signal generator by using a calibration setup.

BACKGROUND

In the state of the art, calibration setups are known that are used to measure and subsequently calibrate a broadband signal generator that outputs an output signal established by a comb signal.

Generally, a comb signal corresponds to an infinite series of (substantially) Dirac delta functions that are spaced from each other, for instance spaced at certain time intervals in time domain or spaced at certain frequency spacings in frequency domain.

The calibration setups typically comprise a narrowband measuring receiver that receives an output signal of the signal generator to be measured, which may correspond to a continuous wave (CW) comb signal. Since the measuring receiver is a narrowband measuring receiver, the output signal of the signal generator has to be measured in an iterative manner, as several portions of the entire output signal of the signal generator are measured subsequently. Accordingly, the narrowband measuring receiver only allows to measure the output signal of the signal generator in a segmented manner, resulting in several segments that together establish the output signal.

However, the segmentation of the output signal results in a propagating failure that limits the overall accuracy.

Accordingly, there is need for a calibration setup and method that ensure a higher accuracy when measuring the signal generator.

SUMMARY

Embodiments of the present disclosure provide a calibration setup for measuring a signal generator. In an embodiment, the calibration setup comprises a calibration unit composed of, for example, one or more circuits, a comb generator composed of, for example, one or more circuits, and configured to output a comb signal as well as the signal generator to be measured that is configured to output an output signal. The comb signal has a higher bandwidth than the output signal. The comb signal has equidistant discrete frequency lines, wherein the output signal has discrete frequency lines. Each of the equidistant discrete frequency lines of the comb signal is different to the discrete frequency lines of the output signal with regard to frequency. Further, the calibration unit is configured to mix the comb signal with the output signal, thereby obtaining a mixed signal.

Furthermore, embodiments of the present disclosure provide a method of measuring a signal generator by using a calibration setup. The method comprises the steps of:

outputting an output signal via the signal generator to be measured, the output signal having discrete frequency lines;

outputting a comb signal via a comb generator, the comb signal having a higher bandwidth than the output signal, the comb signal having equidistant discrete frequency lines, each of the equidistant discrete frequency lines of the comb signal being different to the discrete frequency lines of the output signal with regard to frequency; and mixing the comb signal with the output signal, thereby obtaining a mixed signal.

Accordingly, the measurement is done according to the heterodyne technique. In some embodiments, a heterodyne is a signal frequency that is created by combining or mixing two other frequencies using a signal processing technique called heterodyning. The heterodyne corresponds to the mixed signal obtained after mixing the output signal and the comb signal, both having discrete frequency lines. The discrete frequency lines generally correspond to Dirac delta functions, for example with certain deviations from ideal Dirac delta functions.

In some embodiments, a superheterodyne ("superhet") technique is used, as the output signal of the signal generator is mixed (heterodyned) with the comb signal from the comb generator to produce a lower frequency signal, namely the mixed signal, which is also called the intermediate frequency (IF) signal due to the lower frequency.

Accordingly, the mixed signal provided by the calibration setup has a bandwidth that allows to be measured completely. This ensured since the bandwidth of the spectrum of the mixed is compressed compared to the one of the output signal. Therefore, it is not necessary to acquire or rather measure the output signal of the signal generator in a segmented manner such that failure propagation introduced by the segmentation can be avoided effectively.

In some embodiments, the signal generator outputs the output signal that is mixed with the comb signal provided by the comb generator, wherein the comb signal has a comb spectrum that is shifted in frequency with respect to the spectrum of the output signal of the signal generator. Accordingly, the mixed signal provided comprises the information of the output signal in a compressed manner. The respective compression ratio may be set depending on the frequencies used, which however depends on the signal-to-noise ratio.

The equidistant discrete frequency lines of the comb signal correspond to regularly spaced frequency lines, for example Dirac delta functions.

Generally, the comb signal outputted by the comb generator may have a spectrum reaching from 10 MHz up to 50 GHz, resulting in a bandwidth of up to about 50 GHz.

In contrast, the output signal may have a bandwidth of 8 GHz that is lower than the one of the comb signal. For instance, the output signal corresponds to a radio frequency signal.

Since the comb signal has equidistant discrete frequency lines, the mixed signal obtained can be used for Fast-Fourier Transform (FFT) processing in an efficient manner. In some embodiments, it is possible to average over several Fourier Transforms obtained.

In addition, the time required for measuring the signal generator can be reduced.

Further, simplified components, like synthesizers and analog-to-digital converters due to lower bandwidth of the mixed signal, can be used, thereby reducing the overall costs of the calibration setup. Hence, the accuracy of the calibration setup as well as the respective method is improved.

An aspect provides that each discrete frequency line of the output signal is associated with a corresponding discrete frequency line of the comb signal, thereby forming pairs, namely frequency pairs. In other words, the discrete frequency lines of the comb signal each have a frequency that is close to the respective frequency of the discrete frequency lines of the output signal. Therefore, pairs are formed, wherein each pair consists of one frequency line associated with a comb signal as well as one frequency line associated with the output signal, wherein the frequency lines of each pair are neighbored.

When mixing the comb signal with the output signal, intermodulation products are generated that comprise frequency lines having a respective frequency that corresponds to the frequency spacing of the frequency lines of each pair. This frequency spacing is also called internal frequency spacing since it is provided between the respective frequencies of the frequency lines of the pairs.

Another aspect provides that each pair has an internal frequency spacing between the discrete frequency line of the output signal with respect to the corresponding discrete frequency line of the comb signal. Since each of the equidistant frequency lines is different to the discrete frequency lines of the output signal, the respective frequency spacing occurs.

Furthermore, the internal frequency spacings may be different. Hence, each discrete frequency line of the output signal is spaced from the corresponding frequency line of the comb signal in a different manner compared to the ones of the other pairs. Accordingly, the frequency lines of the mixed signal obtained after mixing the comb signal with the output signal do not overlap, as this would mean that at least two internal frequency spacing are similar.

In some embodiments, the internal frequency spacings increase linearly or the internal frequency spacings decrease linearly. This means that the internal frequency spacings increase linearly with increasing frequency. Alternatively, the internal frequency spacings decrease linearly with increasing frequency. In some embodiments, the linear increasing or linear decreasing of the internal frequency spacing result in regular spaced frequency lines within the mixed signal. This simplifies further processing of the mixed signal, for instance performing a (Fast) Fourier Transform and/or an Inverse (Fast) Fourier Transform.

Another aspect provides that the calibration setup comprises a processing circuit or module. The processing module is enabled to further process the mixed signal obtained. Accordingly, information associated with the output signal can be gathered when further processing the mixed signal obtained after mixing the output signal with the comb signal.

Generally, the mixed signal corresponds to a representative of the output signal provided by the signal generator to be measured.

Hence, the processing module may be connected with an output of the calibration unit. The processing module is enabled to receive the mixed signal that is outputted by the calibration unit for further processing.

For instance, the processing module is configured to transform the mixed signal into time domain. Thus, an Inverse Fast-Fourier Transform (IFFT) may be performed by the processing module.

Further, the processing module may be configured to digitize the mixed signal. Accordingly, an analog-to-digital converter (ADC) is provided that is enabled to digitize the analog mixed signal for further processing.

The calibration setup may also comprise a user interface via which a user is enabled to make settings of the calibration setup. For instance, the user is enabled to select a certain operation mode of the calibration setup for performing the respective method of measuring.

For instance, a frequency spacing of the equidistant discrete frequency lines is selectable. The user may select the respective frequency spacing via the user interface provided. This may be done by setting a certain frequency spacing directly or rather a time interval for the comb signal in time domain that is transformed appropriately.

In any case, the user is enabled to adapt the settings of the calibration setup such that the internal frequency spacing increases or rather decreases in an intended manner, for example in a linear manner.

Another aspect provides that the output signal is a known comb signal that is limited in bandwidth. Certain characteristics of the output signal are known which may be taken into consideration when measuring or rather calibrating the signal generator. In some embodiments, the frequency response of the signal generator can be measured.

For instance, amplitude and phase of the output signal are known. Therefore, the frequency response of the signal generator can be measured with respect to amplitude and phase accordingly.

Generally, an inverse filter may be determined based on the mixed signal, namely the measurement results obtained when measuring the signal generator accordingly. The inverse filter is used to compensate for any (modulation) frequency response.

In some embodiments, the output signal also comprises equidistant frequency lines.

The output signal may be a calibration signal outputted in a calibration mode (Cal Mode) of the signal generator. Thus, the calibration signal may relate to a multi-carrier continuous wave (MCCW) signal. The MCCW signal is mixed with the comb signal that has a comb shifted slightly with respect to the MCCW signal, resulting in the mixed signal, for example an intermodulation product of the mixing, in the intermediate frequency (IF).

However, a continuous wave (CW) signal may also be used for measuring the signal generator. Accordingly, a level control in a sample and hold (S/H) operation mode may also be provided.

According to a further aspect, the calibration unit is connected with an output connector of the signal generator or an input connector of a device under test or a radio frequency device connected with the output connector in order to tap the output signal.

The respective radio frequency device may be interconnected between the signal generator and a device under test that receives the output signal of the signal generator. In some embodiments, the output signal may be tapped at different positions, resulting in different measuring or rather calibration planes. The device under test may be connected with the signal generator via a cable or line.

Another aspect provides that the output signal is tapped at an output connecter of the signal generator or an input connector of a device under test or a radio frequency device connected with the output connector. Therefore, the output signal may be tapped at different positions. The device under test may be connected with the signal generator via a cable. The radio frequency device may be connected between the output connector of the signal generator and a device under test.

Therefore, the output signal corresponds to a signal that is outputted by the signal generator, namely via its output connector.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
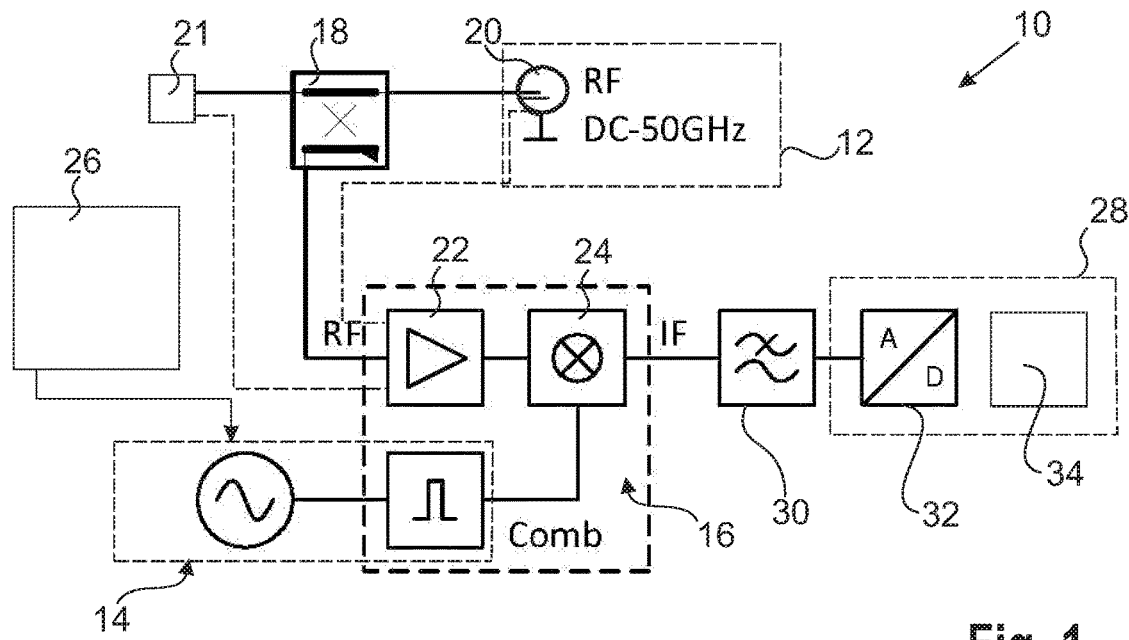
FIG. 1 schematically shows a calibration setup according to an embodiment of the present disclosure.

In FIG. 1, a calibration setup 10 is shown that is used for measuring a signal generator 12 configured to generate an output signal. The calibration setup 10 comprises a comb generator 14 configured to generator a comb signal. Accordingly, the comb generator 14 may comprise a local oscillator and a pulse generator. The comb generator 14 is connected with a calibration unit 16, which in turn, is also connected with the signal generator 12 such that the output signal as well as the comb signal are forwarded to the calibration unit 16 as will be described later in more detail.

In the shown embodiment, the calibration unit 16 is connected with a radio frequency device 18, for instance a directional coupler, that is connected with an output connecter 20 of the signal generator 12. In an embodiment, the calibration unit 16 includes circuitry for carrying out its intended functionality, as described briefly above and in more detail below.

As mentioned above, the signal generator 12 generates the output signal, for instance a radio frequency (RF) signal, which is outputted via the output connecter 20. The calibration unit 16 receives the output signal of the signal generator 12, as the output signal is tapped at the radio frequency device 18. Alternatively, the output signal may be tapped at the output connecter 20 directly or rather an input connecter of a device under test that 21 is connected with the signal generator 12, for instance via a cable or line. These different tap positions are indicated in FIG. 1 by dashed lines accordingly.

Generally, different measuring or rather calibration planes may be used when tapping the output signal at the respective different positions, namely at the input connector of the device under test 21, the separately formed radio frequency device 18 interconnected between the signal generator 12 and the device under test 21 or the output connector 20 of the signal generator 12.

As mentioned above, the comb signal provided by the comb generator 14 as well as the output signal both are forwarded to the calibration unit 16 for further processing.

Figure 2:
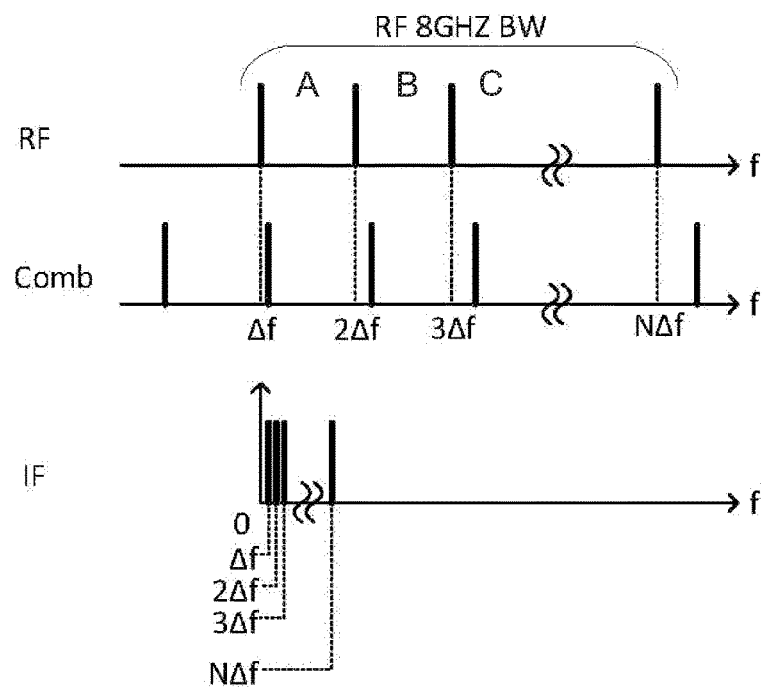
FIG. 2 an overview of spectrums of the output signal, the comb signal and the mixed signal.

In FIG. 2, two representative spectrums of the comb signal and the output signal are shown, which are labelled by "comb" and "RF". It is shown that the comb signal has a higher bandwidth than the output signal of the signal generator 12, as the output signal of the signal generator 12 corresponds to a radio frequency (RF) signal having a bandwidth of 8 GHz. The comb signal may have a bandwidth up to about 50 GHz.

Additionally, the comb signal has equidistant discrete frequency lines, which are regularly spaced from each other in frequency domain as shown in FIG. 2. Further, the output signal of the signal generator 12 also has discrete frequency lines.

In the shown embodiment of FIG. 2, the output signal has equidistant discrete frequency lines as well, which however distinguish from the ones of the comb signal as illustrated in FIG. 2.

Accordingly, each of the equidistant discrete frequency lines of the comb signal is different to the discrete frequency lines of the output signal with regard to frequency, which becomes obvious when comparing the spectrums of the output signal ("RF") and the comb signal ("Comb") shown in FIG. 2.

Generally, the discrete frequency lines may correspond to Dirac delta functions, namely the respective narrow peaks associated with the Dirac delta functions.

In FIG. 1, it is also shown that an (optional) amplifier 22 is provided, which is configured to amplify the output signal of the signal generator 12. The amplifier 22 may be part of the calibration unit 16.

Furthermore, the calibration unit 16 has a mixing stage 24 that receives the comb signal and the (optionally amplified) output signal such that the comb signal is mixed with the output signal, thereby obtaining a mixed signal associated with an intermediate frequency (IF).

Accordingly, a superheterodyne ("superhet") technique is used, as the output signal of the signal generator 12 is mixed (heterodyned) with the comb signal from the comb generator 14 to generate the lower frequency signal, namely the mixed signal, which is also called the intermediate frequency (IF) signal due to its lower frequency.

The spectrum of the mixed signal, namely the IF signal, is also shown in FIG. 2. In this regard, FIG. 2 reveals that the wideband output signal of the signal generator 12 is represented by the mixed signal with a limited bandwidth appropriately such that the mixed signal outputted by the calibration unit 16 can be processed further while having all information of the broadband output signal.

Therefore, the entire mixed signal and, therefore, the information encompassed by the entire output signal can be measured in a non-segmented manner, as the output signal, for example its spectrum, is compressed due to the mixing with the comb signal, as the comb signal has different equidistant discrete frequency lines. This ensures that the intermodulation products are obtained in the mixed signal, for example the intermodulation products of second order, namely $f_1 \pm f_2$, wherein $f_1$ corresponds to the frequency lines of the output signal and $f_2$ corresponds to the frequency lines of the comb signal.

As shown in FIG. 2, each discrete frequency line of the output signal is associated with a corresponding discrete frequency line of the comb signal, thereby forming pairs that are labelled with A, B, C and so on. Each of the pairs has an internal frequency spacing $\Delta f$, $2\Delta f$, $3\Delta f$ and so on, namely a frequency spacing between the discrete frequency line of the output signal with respect to the corresponding discrete frequency line of the comb signal.

The respective internal frequency spacing is illustrated due to the respective projection of the output signal within the spectrum of the comb signal indicated by the dashed lines in FIG. 2. It becomes clear that the internal frequency spacing of each pair is different, as the internal frequency spacings increase linearly with increasing frequency, namely starting from $\Delta f$ to $N\Delta f$.

The linearly increasing frequency spacings is ensured due to the setting of the equidistant frequency lines of the comb signal. Alternatively, the comb signal, for example its frequency spacing, may be different such that the internal frequency spacings of the pairs may decrease linearly with increasing frequency.

In general, the frequency spacing of the equidistant discrete frequency lines of the comb signal provided by the comb generator 14 may be set by a user or the calibration setup 10, for instance by a user interface 26 via which the user is enabled to make settings of the calibration setup 10, for example the comb generator 14.

The calibration setup 10 may also comprise a processing circuit, such as a processing module 28, and a band pass filter 30, for example a low-pass filter. The band pass filter 30 may be used to isolate the intended intermodulation products, namely the IF signal, the spectrum of which is shown in FIG. 2.

The processing module 28 may comprise an analog-to-digital converter (ADC) 32 as well as a transform module 34 that is enabled to transform the mixed signal into time domain. Accordingly, the processing module 28 is generally configured to transform the mixed signal into time domain. Further, the processing module 28 is also configured to digitize the mixed signal.

In some embodiments, the term "module" refers to a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

Generally, the output signal provided by the signal generator 12 is a known signal. In some embodiments, the output signal may relate to a comb signal that is limited in bandwidth. The output signal also has amplitude and phase that are known.

Therefore, the mixed signal can be processed further in order to gather information concerning the frequency response of the signal generator 12 over its entire bandwidth with high accuracy, as it is not necessary to measure the output signal over its entire bandwidth in a segmented manner.

This can be ensured, as the output signal is mixed with the comb signal, thereby obtaining the mixed signal having a significantly lower bandwidth compared to the bandwidth of the output signal as shown in FIG. 2, for example when comparing the output signal with the IF signal obtained after mixing.

This ensures that the mixed signal outputted by the calibration setup 10, for example the calibration unit 16, can be measured by a narrowband measuring receiver.

Figure 3:
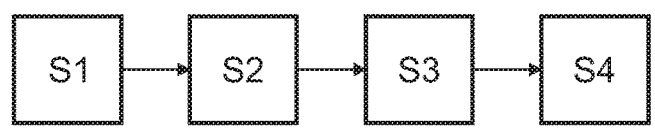
FIG. 3 a flow-chart illustrating a representative method of measuring a signal generator according to an embodiment of the present disclosure.

In general, the calibration setup 10 shown in FIG. 1 can be used to perform a method of measuring the signal generator 12 as shown in FIG. 3. In an embodiment, For this purpose, an output signal is outputted via the signal generator 12 to be measured in a first step S1. As mentioned above, the output signal has discrete frequency lines.

In a second step S2, the comb signal is outputted via the comb generator 14 wherein the comb signal has a higher bandwidth than the output signal. The comb signal has equidistant discrete frequency lines, wherein each of the equidistant frequency lines of the comb signal is different to the discrete frequency lines of the output signal with regard to frequency. This is shown in FIG. 2 as already discussed above.

In a third step S3, the output signal and the comb signal are mixed with each other by the calibration unit 16, for example its mixing stage 24, thereby obtaining a mixed signal for further processing.

The mixed signal is outputted in a fourth step S4 such that the mixed signal can be further processed, for instance by the processing module 28, for example its internal components.

The calibration setup 10, including such components as, for example, the processing circuit 28, etc., is configured to perform one or more steps schematically shown, for example, in FIG. 3. In some embodiments, one or more of these components includes one or more computer-readable media containing computer readable instructions embodied thereon that, when executed by one or more computer circuits (contained in or associated with the calibration setup 10 or components thereof), cause the one or more computer circuits to perform one or more steps of the method of FIG. 3 described above. In some embodiments, the one or more computer circuits, sometimes referred to as computing devices, includes a microprocessor, a microcontroller, a central processing unit, a graphics processing unit (GPU), a digital signal processor (DSP), an application specific integrated circuit (ASIC), etc. Of course, special purpose hardware-based computer systems or circuits can be also employed to perform one or more steps of the method of FIG. 3 described above.

In some embodiments, the one or more computer-readable media contains computer readable instructions embodied thereon that, when executed by the one or more computer circuits, cause the one or more computer circuits to perform one or more steps of any of the methods of Claims 16-17. In some embodiments, computer-readable media is any medium that stores instructions, codes, data, or other information non-transitorily and is directly or indirectly accessible to a computer circuit, such as a processor (e.g., microprocessor, digital signal processor, graphics processor, etc.), etc. In other words, a computer-readable media is a non-transitory memory at which a computer circuit can access instructions, codes, data, or other information. As a non-limiting example, a computer-readable media may be a volatile random access memory (RAM), a persistent data store such as a hard disk drive or a solid-state drive, etc., or a combination thereof. In some embodiments, memory can be integrated with processor, separate from processor, or external to computing system.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously throughout the present disclosure.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In some embodiments, the functionality described herein can be implemented by special purpose hardware-based computer systems or circuits, etc., or combinations of special purpose hardware and computer instructions.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A calibration setup for measuring a signal generator, the calibration setup comprising
   a comb generator configured to output a comb signal and the signal generator to be measured that is configured to output an output signal, the comb signal having a higher bandwidth than the output signal and the comb signal having equidistant discrete frequency lines;
   wherein the output signal has discrete frequency lines, each of the equidistant discrete frequency lines of the comb signal being different to the discrete frequency lines of the output signal with regard to frequency; and
   one or more calibration circuits configured to mix the comb signal with the output signal, thereby obtaining a mixed signal.

2. The calibration setup according to claim 1, wherein each discrete frequency line of the output signal is associated with a corresponding discrete frequency line of the comb signal, thereby forming pairs.

3. The calibration setup according to claim 2, wherein each pair has an internal frequency spacing between the discrete frequency line of the output signal with respect to the corresponding discrete frequency line of the comb signal.

4. The calibration setup according to claim 3, wherein the internal frequency spacings are different.

5. The calibration setup according to claim 3, wherein the internal frequency spacings increase linearly or decrease linearly.

6. The calibration setup according to claim 1, wherein the calibration setup comprises a processing circuit.

7. The calibration setup according to claim 6, wherein the processing circuit is connected with an output of the one or more calibration circuits.

8. The calibration setup according to claim 6, wherein the processing circuit is configured to transform the mixed signal into time domain.

9. The calibration setup according to claim 6, wherein the processing circuit is configured to digitize the mixed signal.

10. The calibration setup according to claim 1, wherein the calibration setup comprises a user interface via which a user is enabled to make settings of the calibration setup.

11. The calibration setup according to claim 1, wherein a frequency spacing of the equidistant discrete frequency lines is selectable.

12. The calibration setup according to claim 1, wherein the output signal is a known comb signal that is limited in bandwidth.

13. The calibration setup according to claim 1, wherein amplitude and phase of the output signal are known.

14. The calibration setup according to claim 1, wherein the output signal is a calibration signal outputted in a calibration mode of the signal generator.

15. The calibration setup according to claim 1, wherein the one or more calibration circuits is connected with an output connector of the signal generator or an input connector of a device under test or a radio frequency device connected with the output connector in order to tap the output signal.

16. A method of measuring a signal generator by using a calibration setup, the method comprising:
   outputting an output signal via the signal generator to be measured, the output signal having discrete frequency lines;
   outputting a comb signal via a comb generator, the comb signal having a higher bandwidth than the output signal, the comb signal having equidistant discrete frequency lines, each of the equidistant discrete frequency lines of the comb signal being different to the discrete frequency lines of the output signal with regard to frequency; and
   mixing the comb signal with the output signal, thereby obtaining a mixed signal.

17. The method according to claim 16, wherein the output signal is tapped at an output connector of the signal generator or an input connector of a device under test or a radio frequency device connected with the output connector.

* * * * *